United States Patent
Horie et al.

(12)

(10) Patent No.: US 6,278,280 B1
(45) Date of Patent: Aug. 21, 2001

(54) BATTERY INACTIVATION DETECTION DEVICE

(75) Inventors: Hideaki Horie, Yokosuka; Toyoaki Nakagawa, Chigasaki; Mikio Kawai, Yokosuka; Yuji Tanjo, Yokohama; Takaaki Abe; Ken Iwai, both of Yokosuka, all of (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 09/311,630

(22) Filed: May 14, 1999

(30) Foreign Application Priority Data

May 14, 1998 (JP) .................................................. 10-132184

(51) Int. Cl.[7] .................................................. G01N 27/416
(52) U.S. Cl. .................................................. 324/436
(58) Field of Search .................................. 324/436, 426, 324/435, 434; 320/125, 126, 134, 136; 340/636; 429/90

(56) References Cited

U.S. PATENT DOCUMENTS

| 5,469,042 | * | 11/1995 | Rühling | 320/122 |
| 5,705,914 | * | 1/1998 | Morita | 340/636 |

FOREIGN PATENT DOCUMENTS 9-84274  3/1997 (JP) .

* cited by examiner

*Primary Examiner*—Peter S. Wong
*Assistant Examiner*—Lawrence Luk
(74) *Attorney, Agent, or Firm*—Foley & Lardner

(57) ABSTRACT

A cell which has become inactive is detected in a multi-cell battery (15) comprising plural cells ($C_n$). An inactivity detecting circuit comprising a signal generator ($D_n1$) and a diode ($D_n2$) connected in series, is connected in parallel with the cell ($C_n$) When the cell becomes inactive, the signal generator ($D_n1$) emits a signal to indicate the state of the cell. Hence, it is possible to economically detect loss of cell activity.

20 Claims, 7 Drawing Sheets

BATTERY INACTIVATION DETECTION DEVICE

FIELD OF THE INVENTION

This invention relates to detection of a cell which has become inactive in a multi-cell battery.

BACKGROUND OF THE INVENTION

When the activity of a battery cell is lost due to minute short-circuits in a multi-cell battery, it is difficult to detect the inactive cell simply from the terminal voltage.

Tokkai Hei 9-84274 published by the Japanese Patent Office in 1997 provides a voltage detecting circuit for each cell, wherein charging/discharging is performed while monitoring the voltage of each cell.

SUMMARY OF THE INVENTION

When a voltage detecting circuit was provided for every cell, the cost of the battery is inevitably increased.

It is therefore an object of this invention to provide a detecting device for detecting a cell which has become inactive.

In order to achieve the above object, this invention provides an inactivity detecting device for detecting a cell which has become inactive in a multi-cell battery comprising plural cells. The device comprises an inactivity detecting circuit connected with a cell in parallel. The inactivity detecting circuit comprises a signal generator and a diode connected in series.

This invention also provides a device for detecting the inactivity of battery modules, each comprising plural cells connected in series, in a multi-cell battery. The device comprises an inactivity detecting circuit connected with a module in parallel. The inactivity detecting circuit comprises a signal generator and a diode connected in series.

This invention also provides a method for detecting an inactivity of a cell in a multi-cell battery comprising plural cells. The method comprises connecting an inactivity detecting circuit with the cell in parallel. The inactivity detecting circuit comprises a signal generator and a diode connected in series. The inactivity of the cell is then detected from a signal generated by the signal generator.

The details as well as other features and advantages of this invention are set forth in the remainder of the specification and are shown in the accompanying drawings.

DESCRIPTION OF THE PREFERRED EMBODIMENTS

Figure 1:
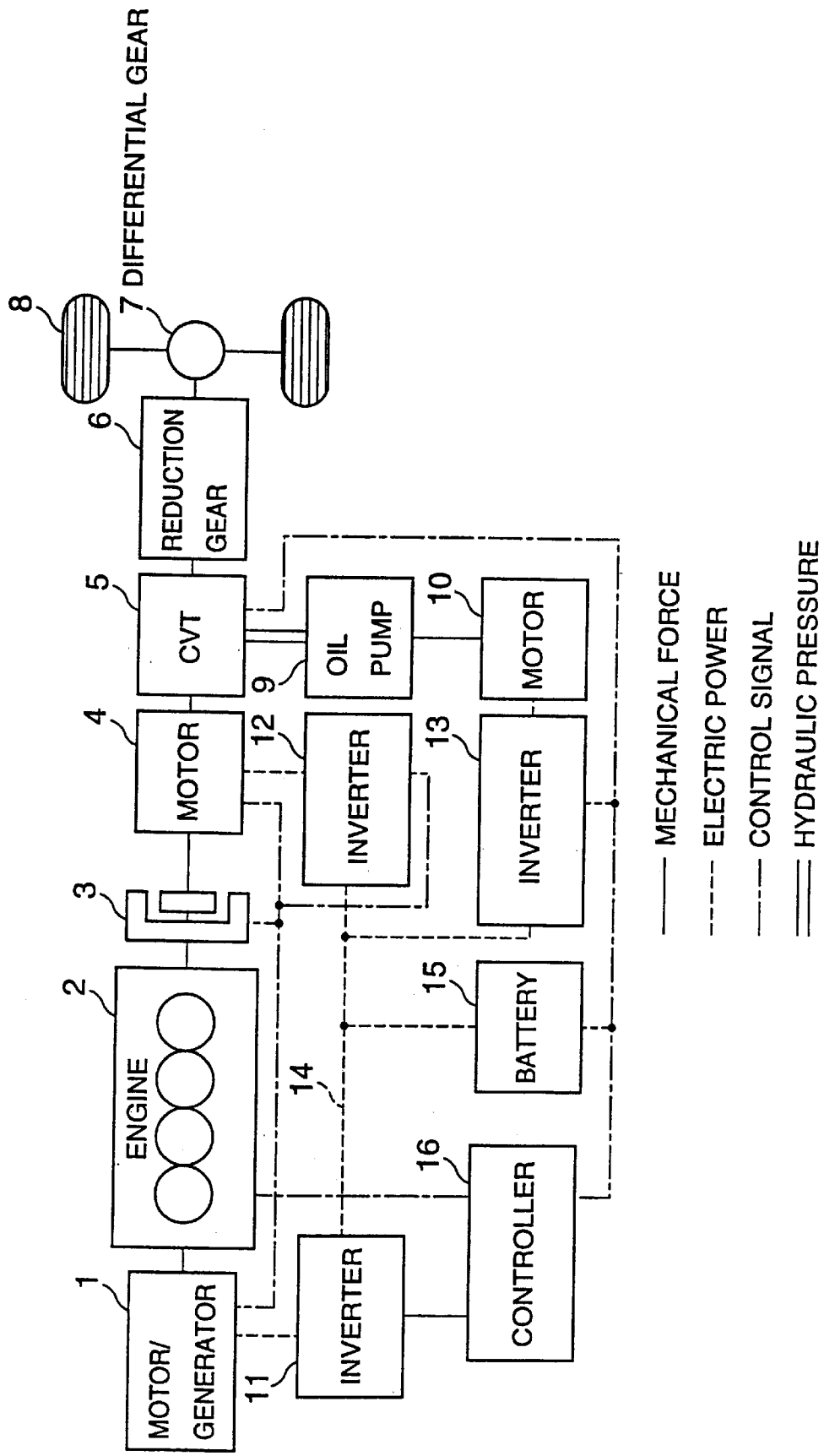
FIG. 1 is a schematic dram of a hybrid vehicle according to this invention.

Referring to FIG. 1 of the drawings, a hybrid vehicle to which this invention is applied drives drive wheels 8 using the power of an engine 2 and motor 4.

The motor 4 is connected to an input shaft of a continuously variable transmission (CVT) 5.

The output shaft of the engine 2 is joined to a rotating shaft of the motor 4 via a clutch 3.

The output of the continuously variable transmission 5 is transmitted to the drive wheels 8 via a reduction gear 6 and a differential gear 7.

When the clutch 3 is engaged, therefore, the drive wheels 8 rotate due to a rotation torque of the engine 2 and motor 4, and when the clutch 3 is disengaged, the drive wheels 8 rotate due only to the rotation torque of the motor 4.

The continuously variable transmission 5 varies a speed ratio according to an oil pressure supplied from an oil pump 9 driven by a motor 10.

A motor/generator 1 is joined to the engine 2.

Due to a supply current from a battery 15, the motor/generator 1 functions as a starter motor for starting the engine 2, and functions as a generator to charge the battery 15 when the engine 2 is running.

The motor/generator 1 and motor 4, 10 are AC devices such as a triphase synchronous motor or triphase induction motor.

If a motor/generator is applied to the motor 4, electricity is generated by the rotation torque of the drive wheels 8 when the vehicle is slowing down, and a regenerative braking force based on the rotation resistance at this time may also be arranged to apply to the drive wheels 8.

The clutch 3 is an electromagnetic powder clutch which can regulate the transmission torque, but a dry type sheet clutch or wet type multiple disc clutch can also be used.

The motor/generator 1 and motor 4, 10 are respectively controlled by inverters 11, 12 and 13.

DC current motors may also be used for the motor/generator 1 and motor 4,10. In this case, DC/DC converters may be used instead of the inverters 11, 12 and 13.

The inverters 11, 12 and 13 are connected to the battery 15 via a common DC link 14.

The inverters 11, 12 and 13 convert DC power stored in the battery 15 to AC power, and supply this to the motor/generator 1 and motor 4,10.

The inverter 11 also converts AC power generated by the motor/generator 1 and charges the battery 15.

If the motor 4 performs regenerative braking as described above, the power generated by the motor 4 during regenerative braking may be used directly as a drive force for the DC motor 10 or motor/generator 1 via the DC link 14. The battery 15 may be a lithium ion battery, a nickel metal hydride battery or a lithium polymer battery.

The rotation speed of the engine 2, transmission torque of the clutch 3, rotation speed of the motor/generator 1 and motor 4, 10, speed ratio of the continuously variable transmission 5 and charging/discharging of the battery 15 are respectively controlled by output signals from a controller 16.

The controller 16 comprises a microcomputer comprising a central processing unit (CPU), read only memory (ROM), random access memory (RAM) and input/output (I/O) interface.

The controller 16 controls the rotational speed of the engine 2, transmission torque of the clutch 3, rotational speed of the motors 1,4,10, speed ratio of the continuously variable transmission 5, and charging/discharging of the battery 15.

Next, the circuit of the battery 15 will be described referring to FIG. 2.

The battery 15 is a multi-cell battery wherein n battery cells are connected in series.

An inactivity detecting circuit is connected between a positive and a negative electrode of the cells $C_n$. The inactivity detecting circuit comprises light emitting diodes (LED) $D_n1$, $D_n2$, and resistors $R_n$ which are connected in series. The "n" attached to the signs of members specifies a positive integer.

The cathodes of the light emitting diodes $D_n1$, $D_n2$ are connected to the anode side of the cell $C_n$. The resistor $R_n$ is a protection resistor for preventing $D_n2$ may be a non-light emitting diode, such as shown in FIG. 2 a current exceeding the maximum rated current from flowing through the light-emitting diodes $D_n1$, $D_n2$.

Figure 3A:
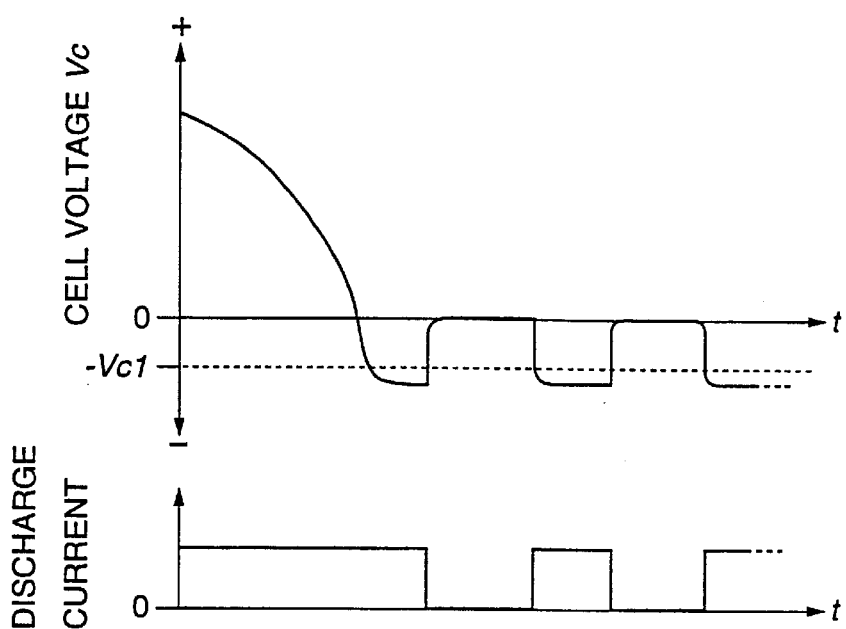
FIGS. 3A and 3B are timing charts showing the relation between cell voltage and discharge current during discharge.
Figure 3B:
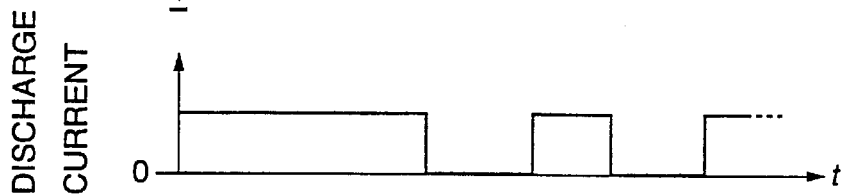

FIG. 3 shows the relation between a cell voltage Vc and discharge current while the cell $C_n$ is discharging.

In a multi-cell battery comprising plural cells connected in series, if discharging is performed when any cell is inactive and its voltage Vc is 0, a polarity inversion occurs due to the internal resistance of the cell, and the diode $D_n2$ becomes conducting so that part of the discharge current flows through the inactivity detecting circuit.

When the voltage Vc which is directly proportional to the product of the internal resistance of the inactive cell and the discharge current, falls below Vcl, the light-emitting diode $D_n1$ lights so as to warn the user that the cell has become inactive.

Hence, an economical device can be provided wherein the inactive state of a cell can be displayed merely by connecting an inactivity detecting circuit having diodes $D_n1$, $D_n2$ to each of the cells $C_n$.

Figure 4:
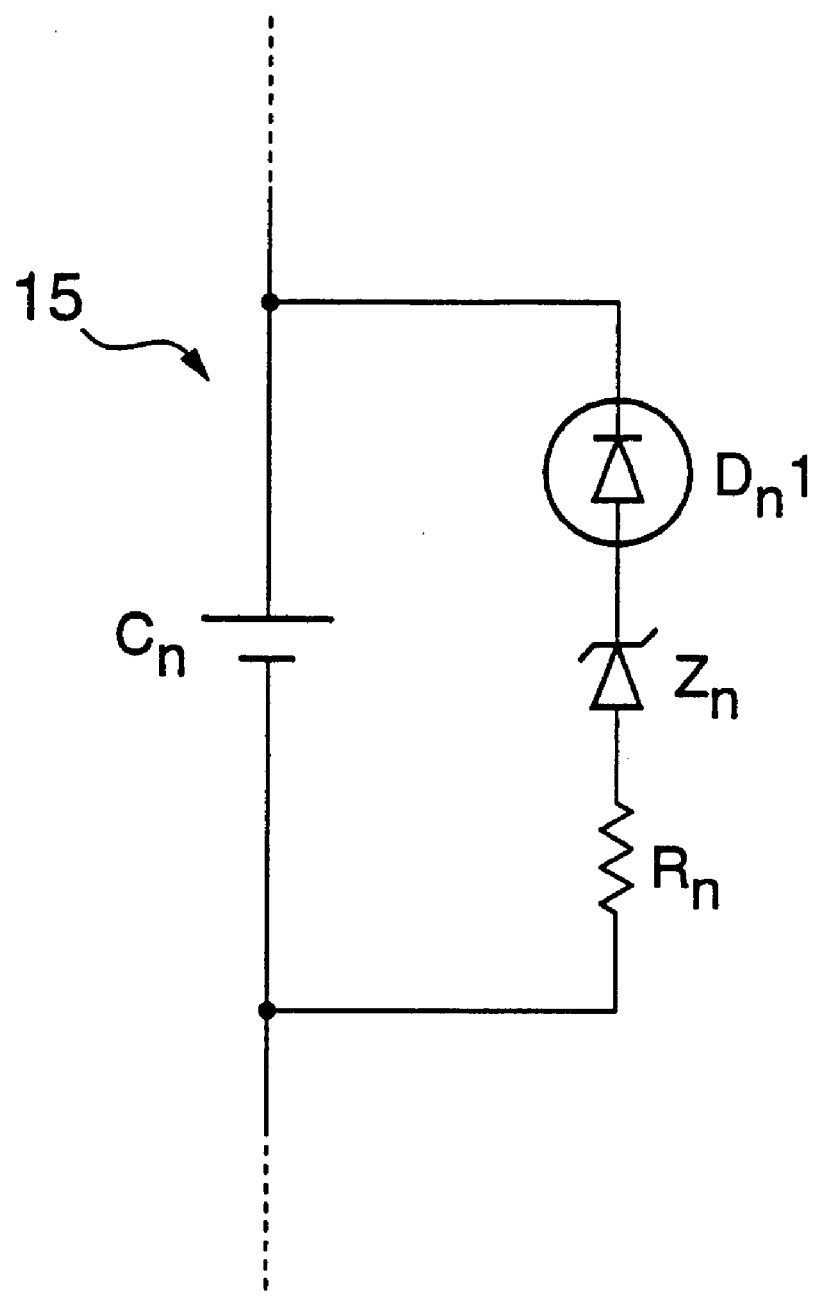
FIG. 4 is a circuit diagram of an inactivity detecting circuit according to a second embodiment of this invention.

Next, a second embodiment of the invention will be described referring to FIG. 4.

Figure 2:
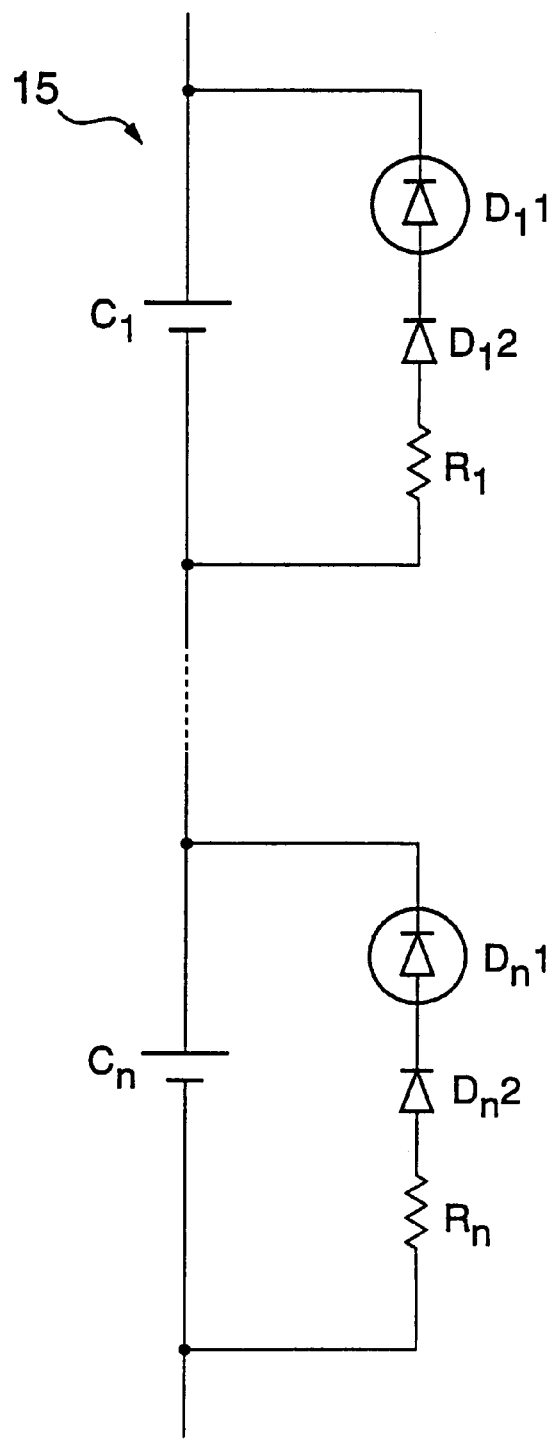
FIG. 2 is a schematic diagram of an inactivity detecting circuit according to this invention.

According to this embodiment, a Zener diode $Z_n$ is used instead of the diode $D_n2$ of the inactivity detecting circuit shown in FIG. 2.

The cathode of the Zener diode $Z_n$ is connected to the anode side of the cell $C_n$. When the cell $C_n$ is discharging, an identical function to that of the diode $D_n2$ of the aforesaid first embodiment is provided by the characteristics of the arrangement of Zener diodes $Z_n$. Also, when the cell charging cell voltage Vc exceeds a Zener voltage VZ of the Zener diode $Z_n$, the charging current that should flow into the cell $C_n$ flows into the inactivity detecting circuit.

Therefore, according to this embodiment, not only can an inactive cell be displayed, but overcharging of the cells can be prevented, and the voltage of each cell can be made uniform.

Figure 5:
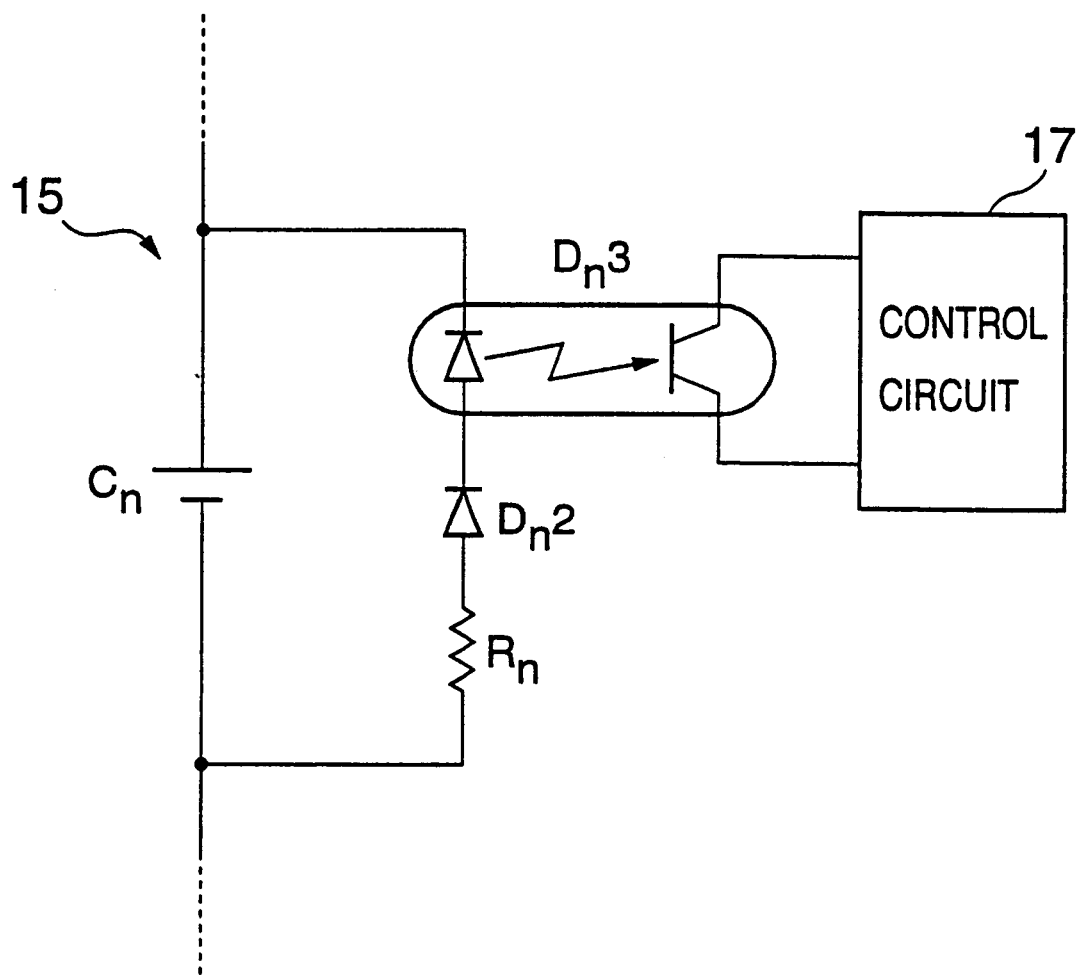
FIG. 5 is a circuit diagram of an inactivity detecting circuit according to a third embodiment of this invention.

Next, a third embodiment of the invention will be described referring to FIG. 5.

This embodiment uses a photocoupler $D_n3$ instead of the light emitting diode $D_n1$ of the aforesaid first embodiment. A control circuit 17 is connected to the output terminal of the photocoupler $D_n3$ of each of the cells $C_n$.

If a cell becomes inactive and polarity inversion occurs during discharge, current flows into the inactivity detecting circuit, and the photocoupler $D_n3$ outputs a signal to a control circuit 17. When the control circuit 17 receives this signal, a message is displayed showing the inactive cell together with an alarm.

According to this embodiment, not only is an inactive cell displayed, but an interlock signal so as to stop charging and discharging of the battery 15 is output from the control circuit 17 which is insulated from the battery 15, when inactivation occurs. By using the photocoupler $D_n3$ therefore, it is not necessary to arrange a special insulation between the signal output circuit and the battery 15 as in the case where the inactivity signal is output via an electric wire.

Figure 6:
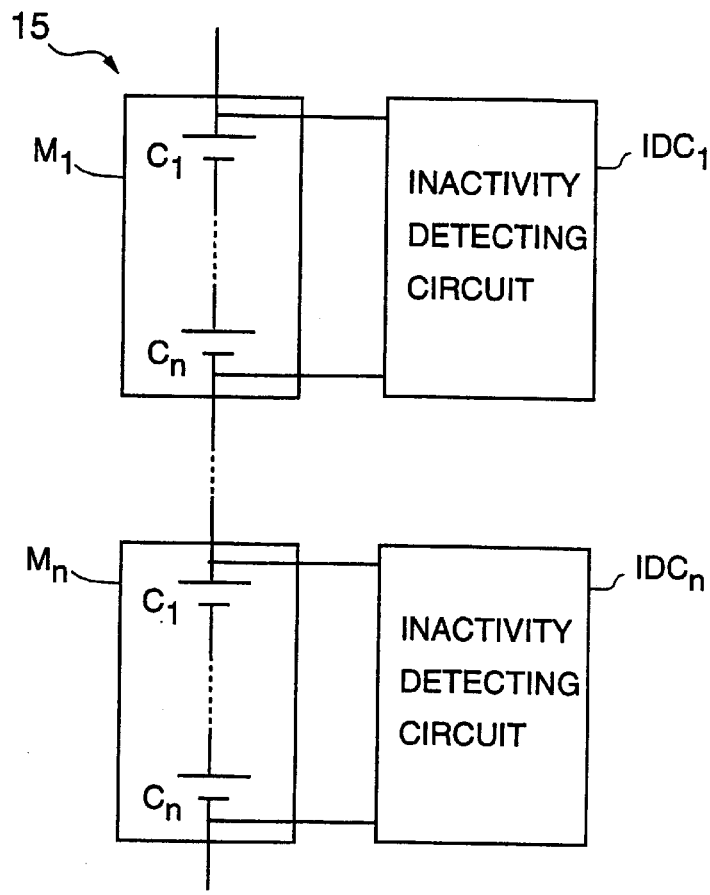
FIG. 6 is a circuit diagram of an inactivity detecting circuit according to a fourth embodiment of this invention.
Figure 7:
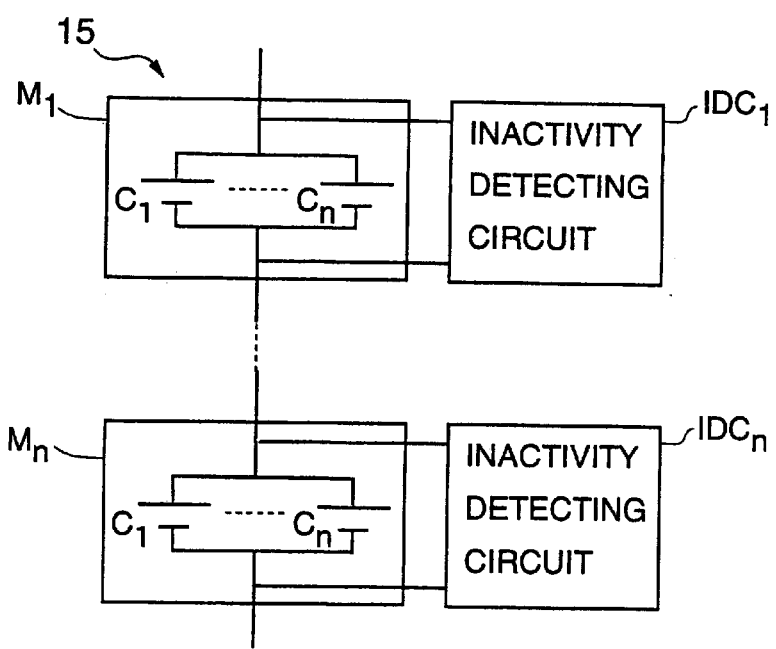
FIG. 7 is similar to FIG. 6, but showing a case where each of modular units comprises plural cells connected in parallel.
Figure 8:
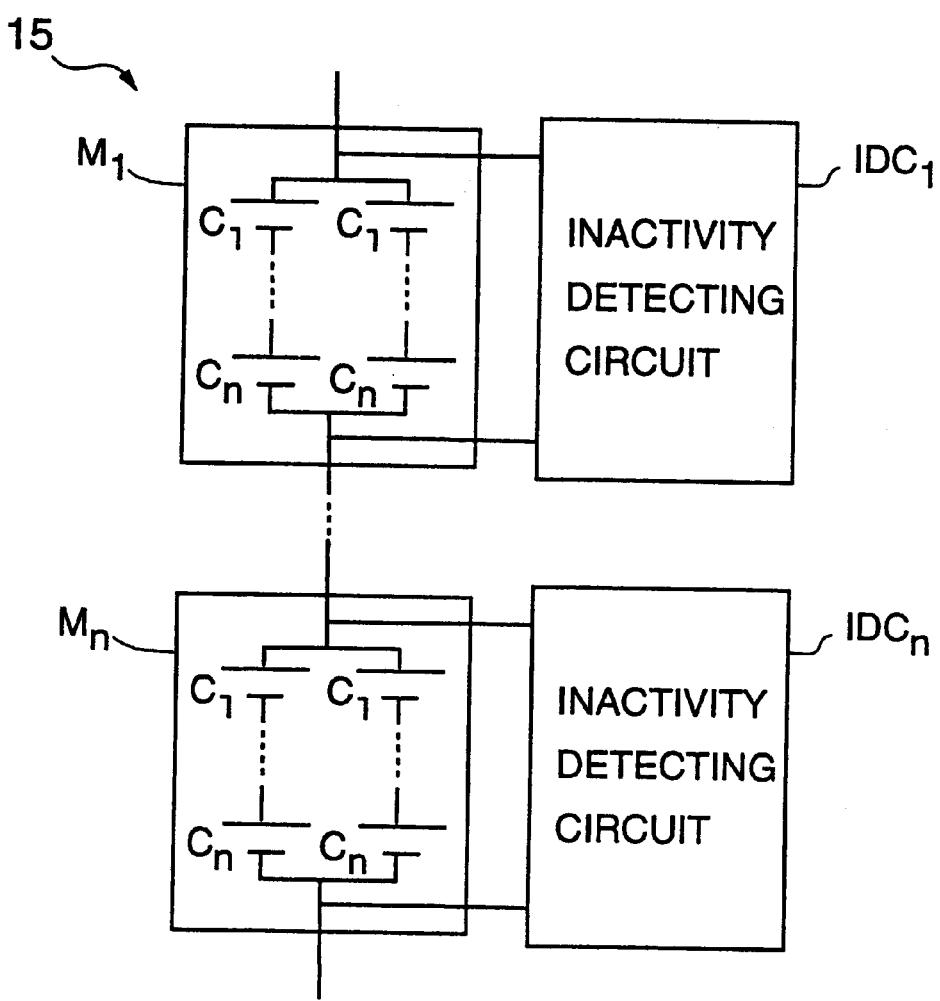
FIG. 8 is similar to FIG. 6, but showing a case where each of modular units comprises plural cells connected both in series and in parallel.

Next, a fourth embodiment of the invention will be described referring to FIGS. 6–8.

In this embodiment, the battery 15 comprises plural modular unit $M_n$ each comprising plural cells $C_n$. The cells $C_n$ may be connected in series as shown in FIG. 6, or in parallel as shown in FIG. 7, or in a complex configuration of both as shown in FIG. 8.

This invention may be applied to detect an inactive modular unit $M_n$ in these batteries 15. For this purpose, the inactivity detecting circuit $IDC_n$ according to any of the aforesaid first–third embodiments is provided for each modular unit $M_n$ instead of detecting the inactivity of each cell $C_n$.

The contents of Tokugan Hei 10-132184, with a filing date of May 14, 1998 in Japan, are hereby incorporated by reference.

Although the invention has been described above by reference to certain embodiments of the invention, the invention is not limited to the embodiments described above. Modifications and variations of the embodiments described above will occur to those skilled in the art, in light of the above teachings.

For example, this invention is applied to a hybrid vehicle in the above embodiments, but it can be applied to various batteries of various electric vehicles including hybrid vehicles. It is also applicable to batteries other than those installed in electric vehicles.

What is claimed:

1. An inactivity detecting device for detecting a cell which has become inactive in a multi-cell battery comprising plural cells, comprising:

an inactivity detecting circuit connected with said cell in parallel, said inactivity detecting circuit comprising a signal generator and a diode connected in series, wherein said inactivity detecting circuit provides an inactivity signal generated from polarity inversion in the cell.

2. An inactivity detecting device as defined in claim 1, wherein said inactivity detecting circuit is connected to each cell of the multi-cell battery.

3. An inactivity detecting device as defined in claim 1, wherein said signal generator comprises a light-emitting diode.

4. An inactivity detecting device as defined in claim 1, wherein said signal generator comprises a photocoupler.

5. An inactivity detecting device as defied in claim 4, further comprising a control circuit which stops charging and discharging of the battery in response to an output signal of said photocoupler.

6. An inactivity detecting device as defined in claim 1, wherein said diode comprises a Zener diode.

7. An inactivity detecting device as defined in claim 1, wherein said signal generator provides said inactivity signal.

8. An inactivity detecting device as defined in claim 7, wherein said diode becomes conducting in response to said polarity inversion in the cell.

9. An inactivity detecting device as defined in claim 1, wherein said diode becomes conducting in response to said polarity inversion in the cell.

10. An inactivity detecting device as defined in claim 9, wherein said inactivity detecting circuit detects a current generated from said polarity inversion in the cell.

11. An inactivity detecting device as defined in claim 10, wherein said signal generator generates said inactivity signal when said current generated from said polarity inversion in the cell reaches a predetermined value.

12. An inactivity detecting device as defined in claim 1, wherein said inactivity detecting circuit detects a current generated from said polarity inversion in the cell.

13. An inactivity detecting device as defined in claim 12, wherein said signal generator generates said inactivity signal when said current generated from said polarity inversion in the cell reaches a predetermined value.

14. An inactivity detecting device for detecting an inactivity of a modular unit in a battery comprising plural modular units connected in series, wherein each modular unit comprises plural cells, said device comprising:

an inactivity detecting circuit connected with a modular unit in parallel, said inactivity detecting circuit comprising a signal generator and a diode connected in series, wherein said inactivity detecting circuit provides an inactivity signal generated from polarity inversion in the modular unit.

15. A method for detecting an inactivity of a cell in a multi-cell battery comprising plural cells, comprising:

connecting an inactivity detecting circuit connected with said cell in parallel, said inactivity detecting circuit comprising a signal generator and diode connected in series, and detecting the inactivity of the cell from an inactivity signal generated by said signal generator, which inactivity signal is generated from polarity inversion in the cell.

16. The method for detecting an inactivity of a cell as defined in claim 15, further comprising:

detecting a current in said inactivity detecting circuit generated from said polarity inversion in the cell.

17. An electric vehicle including an inactivity detecting device for detecting a cell which has become inactive in a multi-cell battery comprising plural cells, comprising:

an inactivity detecting circuit connected with at least one of said cells in parallel, said inactivity detecting circuit comprising a signal generator and a diode connected in series, wherein said inactivity detecting circuit provides an inactivity signal generated from polarity inversion in the cell.

18. An electric vehicle as defined in claim 17, wherein said signal generator provides said inactivity signal, and wherein said diode becomes conducting in response to said polarity inversion in the cell.

19. An electric vehicle as defined in claim 17, wherein said inactivity detecting circuit detects a current generated from said polarity inversion in the cell.

20. An electric vehicle as defined in claim 17, further comprising:

an engine;

a motor/generator operatively coupled with said engine and said battery, said motor/generator provides for starting said engine and charges said battery during engine operation;

a motor operatively coupled with said engine through a clutch; and drive wheels operatively coupled to said motor, wherein said drive wheels are driven using power of said engine and said motor.

* * * * *